(12) United States Patent
Tanaka

(10) Patent No.: US 7,365,477 B2
(45) Date of Patent: Apr. 29, 2008

(54) PIEZOELECTRIC VIBRATING ELEMENT AND PIEZOELECTRIC VIBRATOR

(75) Inventor: Masako Tanaka, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 156 days.

(21) Appl. No.: 11/360,419

(22) Filed: Feb. 24, 2006

(65) Prior Publication Data
US 2006/0192460 A1   Aug. 31, 2006

(30) Foreign Application Priority Data
Feb. 28, 2005   (JP) .............................. 2005-052605

(51) Int. Cl.
*H01L 41/02* (2006.01)
(52) U.S. Cl. ...................... 310/348; 310/365
(58) Field of Classification Search ................ 310/348, 310/370, 330–332, 363–366
See application file for complete search history.

(56) References Cited

U.S. PATENT DOCUMENTS 4,656,707 A * 4/1987 Berte et al. ................ 29/25.35

FOREIGN PATENT DOCUMENTS

| EP | A-0191479 | 8/1986 |
|---|---|---|
| JP | A-61003514 | 5/1986 |
| JP | A 07-212171 | 8/1995 |
| JP | A 09-027729 | 1/1997 |

* cited by examiner

*Primary Examiner*—J. San Martin
(74) *Attorney, Agent, or Firm*—Oliff & Berridge, PLC

(57) ABSTRACT

A piezoelectric vibrating element that includes: a main vibrating unit vibrating in a constant direction, an exciting electrode being formed on a top face and a bottom face of the main vibrating unit; an open end formed on at least one of a plurality of ends provided in a vibrating direction of the main vibrating unit; an outer frame unit formed so as to surround the main vibrating unit; a connecting unit formed so as to connect the main vibrating unit and the outer frame unit, wherein the connection unit is provided between the main vibrating unit and the outer frame unit except an area where the open end is formed, and is composed of a recess concave to a top face of the main vibrating unit and a flat part approximately in parallel with the top face of the main vibrating unit; and a connecting electrode formed in a manner of starting from the exciting electrode, passing at least through the top face of the flat part, to the top face of the outer frame unit, wherein an angle θ1 that makes the top face of the flat part with respect to a connecting face to which the flat part and the outer frame unit are connected, and an angle θ2 that makes the top face of the outer frame unit with respect to the connecting face satisfy a relation: 90°<θ1<270° and 90°<θ2≦180°.

6 Claims, 7 Drawing Sheets

(S102)

(S104)

(S106)

(S108)

PIEZOELECTRIC VIBRATING ELEMENT AND PIEZOELECTRIC VIBRATOR

BACKGROUND

1. Technical Field

The present invention relates to a piezoelectric vibrating element that includes a main vibrating unit and an outer frame unit surrounding the main vibrating unit integrally on an identical piezoelectric substrate, and a piezoelectric vibrator.

2. Related Art

In these years, as electronic apparatuses are becoming smaller and smaller in size, piezoelectric vibrators used for such electronic apparatuses and piezoelectric vibrating elements used for such piezoelectric vibrators are also required to be reduced in size and in thickness. A piezoelectric vibrating element 500, for example, such as shown in FIG. 11 is proposed in order to reduce, in size and in thickness, piezoelectric vibrators and piezoelectric vibrating elements used for such piezoelectric vibrators. FIG. 11 shows, as an example of a conventional piezoelectric vibrating element, an AT cut vibrating element that uses a quartz substrate. FIG. 11A is a plan view, while FIG. 11B is a front sectional view. As shown in FIGS. 11A and 11B, the piezoelectric vibrating element 500 is composed of a main vibrating unit 502 formed on the center part of a quartz substrate (quartz wafer) 501, an outer frame unit 503 and a connecting unit 504. The main vibrating unit 502, the outer shape of which is formed by a through hole 505 placed around its periphery, is connected integrally to the outer frame unit 503 with two connecting units 504, which are areas where the through hole 505 is not formed. The connecting unit 504, the width of which is around 200 μm, is formed in a manner that its top and bottom faces 508 and 509 are placed closer to the center of the thickness direction than the top and bottom faces 506a and 506b of the main vibrating unit 502 and the top and bottom faces 507a and 507b of the outer frame unit 503. Therefore, the top and bottom faces 508 and 509 of the connecting units 504 are connected to the top and bottom faces 506a and 506b of the main vibrating unit 502 and to the top and bottom faces 507a and 507b of the outer frame unit 503, respectively with a certain level difference. The outer frame unit 503 is formed approximately in a manner of surrounding the periphery of the main vibrating unit 502, as is proposed, for example, in JP-A-7-212171. Exciting electrodes 510a and 510b are formed on the top and bottom faces 506a and 506b of the main vibrating unit 502. In connection with the exciting electrodes 510a and 510b, connecting electrodes 511a and 511b are formed, passing through the connecting units 504 to reach the top and bottom faces 507a and 507b of the outer frame unit 503. The connecting electrodes 511a and 511b are formed with a metal thin film such as gold or silver by a chemical etching method using a photoresist as a mask.

However, the top and bottom faces 508 and 509 of the connecting units 504 are formed so as to respectively have a certain level difference, with respect to the top and bottom faces 506a and 506b of the main vibrating unit 502, and with respect to the top and bottom faces 507a and 507b of the outer frame unit 503, as mentioned above. Thus, corner parts (ridge line parts) 512a and 512b are formed that are made with the side surfaces of the part corresponding to the level difference and the top and bottom faces 506a and 506b of the main vibrating unit 502, as well as the top and bottom faces 507a and 507b of the outer frame unit 503. There is a case where the angle D on the corner parts 512a and 512b becomes smaller than 90 degrees in the course of forming the outline of the piezoelectric vibrating element 500. In such a case that the angle D on the corner parts 512a and 512b becomes smaller than 90 degrees, a photoresist for forming the connecting electrodes 511a and 511b and the like may sometimes not be formed on the corner parts 512a and 512b.

This phenomenon may be attributed to the following causes. (1) The photoresist is drawn bilaterally at the corner parts 512a and 512b due to the surface tension of the photoresist. (2) The photoresist is usually applied using a device called a spin coater. This device, using the centrifugal force created by spinning the quartz substrate 501, applies the photoresist dropped on the center part of the quartz substrate 501 to all over the quartz substrate 501. At this timing, in the case where any above-mentioned angle D is smaller than 90 degrees on the surface of the quartz substrate 501, resulting in some areas on which the photoresist is not applied since clearances are too small for the photoresist to enter them.

If chemical etching is carried out in such a situation for forming the connecting electrodes 511a and 511b and the like, the connecting electrodes 511a and 511b are exposed with the etching solution, that correspond to the corner parts 512a and 512b which are not masked with the photoresist. Thus, a problem in that the connecting electrodes 511a and 511b are blown out, so-called an electrode disconnection, occurs at the corner parts.

SUMMARY

An advantage of the invention is to provide a piezoelectric vibrating element that can prevent the electrode disconnection on the corner part of the connecting electrodes so that the connecting electrodes can be surely connected all the way from the main vibrating unit, passing through the connecting unit, to the outer frame unit, and a piezoelectric vibrator.

A first aspect of the invention is to provide a piezoelectric vibrating element that includes: a main vibrating unit, on the top and bottom faces of which an exciting electrode is formed, vibrating in a constant direction; an open end formed on at least one of ends provided in the vibrating direction of the main vibrating unit; an outer frame unit formed so as to surround the main vibrating unit; a connecting unit formed so as to connect the main vibrating unit and the outer frame unit, in which the connection unit is provided between the main vibrating unit and the outer frame unit except an area where the open end is formed, and is composed of a recess concave to the top face of the main vibrating unit and a flat part approximately in parallel with the top face of the main vibrating unit; and a connecting electrode formed in a manner of starting from the exciting electrode, passing at least through the top face of the flat part, to the top face of the outer frame unit. An angle $\theta 1$ that makes the top face of the flat part with respect to a connecting face to which the flat part and the outer frame unit are connected and an angle $\theta 2$ that makes the top face of the outer frame unit with respect to the connecting face satisfy a relation:

$$90° < \theta 1 < 270° \text{ and } 90° < \theta 2 \leq 180°.$$

In the piezoelectric vibrating element according to the first aspect of the invention, each of the angles $\theta 1$ and $\theta 2$ is an obtuse angle more than 90 degrees. The $\theta 1$ is the angle made by the surface of the flat part and the connecting face of the flat part and the outer frame unit, both of which form the connecting electrode, while θ2 is the angle made by the surface of the flat part and the surface of the outer frame unit. Therefore, the disadvantages such as that the photoresist is drawn bilaterally from the corner part due to the surface tension of the photoresist and that the photoresist is not applied due to the shadow of the quartz substrate can be prevented. Thus, the corner part is covered with the photoresist, which can prevent the blowing out of the electrode on the corner part when chemical etching is carried out for forming the connecting electrode and the like. Therefore, the disadvantage that the conduction on the connecting electrode is disconnected due to the blowing out, or the so-called electrode disconnection, can be prevented.

Further, the concave recess can prevent, due to its recessed shape, the leaking of vibration from the main vibrating unit to the outer frame unit. Thus, the influence on the vibrating properties can be reduced even if a concave recess is placed and the length of the connecting unit becomes larger. Therefore, the connecting unit can be composed of the concave recess and the flat part that is approximately in parallel with the top and bottom faces of the main vibrating unit, which intensifies the strength of the connecting unit. Thus, the breakage of the connecting unit due to external impact and the like can be prevented.

Because an open end is formed on at least one of the ends in the vibrating direction of the main vibrating unit, the expansion and contraction of the main vibrating unit due to temperature change can be absorbed by this open end. Thus, the main vibrating unit can make a stable vibration even in the case of temperature change, which improves the so-called frequency-temperature characteristics.

In this way, the piezoelectric vibrating element according to the invention can prevent the electrode disconnection on the corner part, can improve the shock resistance, and can make a stable vibration even in the case of temperature change, making it possible to provide a highly reliable piezoelectric vibrating element.

It is preferable that the flat part is formed on the approximately same plane surface with the top face of the main vibrating unit.

Forming the flat part, which is the approximately same plane surface with the top and bottom faces of the main vibrating unit, on the connecting unit prevents the occurrence of level difference between the top and bottom faces of the main vibrating unit and the flat part. Thus, the stress concentration which would occur on the corner part of the level difference and the destruction due to the stress concentration can be prevented. Therefore, the shock resistance on the connecting unit on which the flat part is formed can be improved.

Further, it is preferable that the top face of the outer frame unit is formed on the approximately same plane surface with the top face of the main vibrating unit and the top face of the flat part.

In this way, the surfaces of the main vibrating unit, the connecting unit, and the outer frame unit are approximately the same, where the connecting electrode is formed. Thus, the corner part is not present on the region on which the connecting electrodes are formed, which in turn prevents the occurrence of electrode disconnection.

Further, it is preferable that the open ends are formed on the both ends of the main vibrating unit in the vibrating direction.

In this way, the expansion and contraction of the main vibrating unit and of the outer frame unit due to temperature change can be absorbed on the both ends in the vibrating direction, making it possible to further reduce the influence on the vibrating properties by mitigating the stress added to the main vibrating unit.

A second aspect of the invention is to provide a piezoelectric vibrator that includes the above-mentioned piezoelectric vibrating element, and a cover body that houses at least the main vibrating unit of the piezoelectric vibrating element, and is connected to the outer frame unit.

In a piezoelectric vibrating element used for a piezoelectric vibrator according to the second aspect of the invention, each of the angles θ1 and θ2 is an obtuse angle more than 90 degrees. The θ1 is the angle made by the surface of the flat part and the connecting face of the flat part and the outer frame unit, both of which form the connecting electrode, while θ2 is the angle made by the surface of the flat part and the surface of the outer frame unit. Therefore, the disadvantages such as that the photoresist is drawn bilaterally from the corner part due to the surface tension of the photoresist and that the photoresist is not applied due to the shadow of the substrate can be prevented. Thus, the corner part is covered with the photoresist, which can prevent the blowing out of the electrode on the corner part when chemical etching is carried out for forming the connecting electrode and the like. Therefore, the disadvantage that the conduction on the connecting electrode is disconnected due to the blowing out, or the so-called electrode disconnection, can be prevented.

Further, the concave recess can prevent, due to its recessed shape, the leaking of vibration from the main vibrating unit to the outer frame unit. Thus, the influence on the vibrating properties can be reduced even if the concave recess is placed and the length of the connecting unit becomes larger. Therefore, the connecting unit can be composed of the concave recess and the flat part that is approximately in parallel with the top and bottom faces of the main vibrating unit, which intensifies the strength of the connecting unit. Thus, the destruction of the connecting unit due to external impact and the like can be prevented.

Because an open end is formed on at least one of the ends in the vibrating direction of the main vibrating unit, the expansion and contraction of the main vibrating unit due to temperature change can be absorbed by this open end. Thus, the main vibrating unit can make a stable vibration even in the case of temperature change, which improves the so-called frequency-temperature characteristics.

Further, the piezoelectric vibrator according to the second aspect of the invention includes at least the main vibrating unit of the piezoelectric vibrating element with the cover body connected to the outer frame unit of the above-mentioned piezoelectric vibrating element. Thus, the main vibrating unit can be protected by the cover body.

As mentioned so far, a piezoelectric vibrator that can prevent the electrode disconnection on the corner part, and that has good shock resistance, and that can make a stable vibration even in the case of temperature change can be provided according to the second aspect of the invention.

Further, it is preferable that the cover body is fixed to the outer frame unit with a frame body formed approximately along the outer frame unit with a constant thickness.

In this way, the contact of the main vibrating unit or the like to the cover body when the cover body is fixed, in the case where the surface of the main vibrating unit of the piezoelectric vibrating element is located outside the surface of the outer frame unit in terms of thickness direction or is located on the same plane surface, can be prevented. Thus, the degradation of the vibrating properties due to the contact of the main vibrating unit and the cover body can be

BRIEF DESCRIPTION OF THE DRAWINGS

The invention will be described with reference to the accompanying drawings, wherein like numbers reference like elements.

DESCRIPTION OF EXEMPLARY EMBODIMENTS

In advance of describing exemplary embodiments, a piezoelectric vibrating element according to the first aspect of the invention, a forming method of its electrode, and the electrode disconnection on the corner part that occurs in forming the electrode will be described in detail.

Various kinds of piezoelectric materials, such as quartz, are used for the piezoelectric vibrating element. Examples of a piezoelectric material include a quartz crystal having an X axis (electrical axis), a Y axis (mechanical axis) and a Z axis (optical axis), which are crystallographic axes. A quartz vibrating element is generated using a quartz substrate, as a piezoelectric substrate, that is cut out from the quartz crystal. An AT cut quartz substrate is an example of the quartz substrate, one side of which is in parallel with the X axis and the other side of which is cut out in parallel with the Z' axis that has an inclination of approximately 35 degrees from the Z axis about the X axis. In the following embodiments, examples of a piezoelectric vibrating element that uses the AT cut quartz substrate are shown. The piezoelectric vibrating element is not limited to an AT cut quartz substrate. Quartz substrates cut out with other cutting angles or piezoelectric vibrating elements using other piezoelectric materials can be also used. Also in such cases, the same effects are achieved as long as the structure is the same as in the following embodiments.

Figure 1:
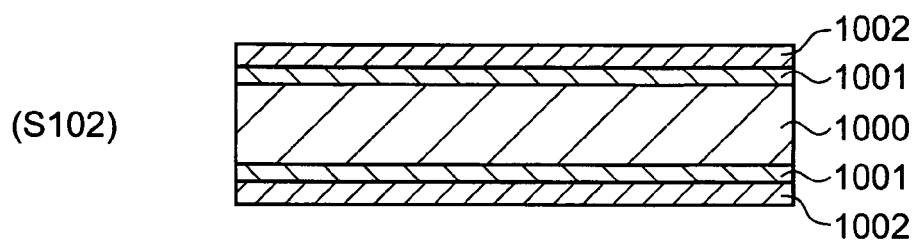
FIG. 1 is a process flowchart showing an example of an electrode forming method of a piezoelectric vibrating element.
Figure 1:
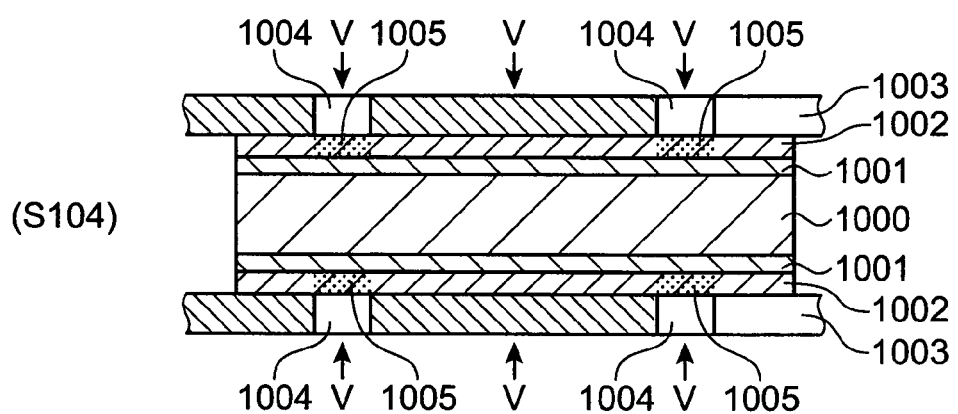
Figure 1:
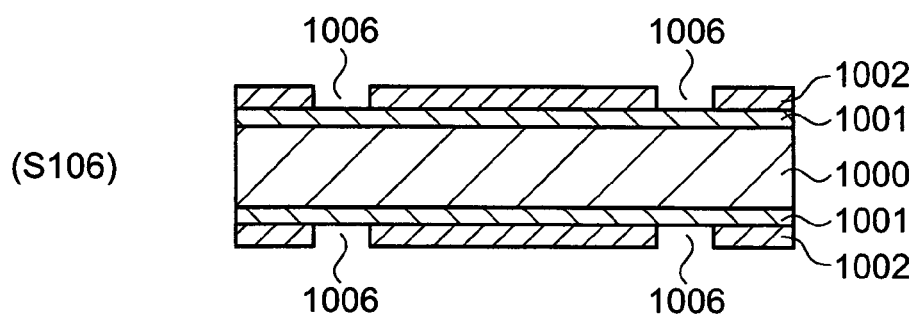
Figure 1:
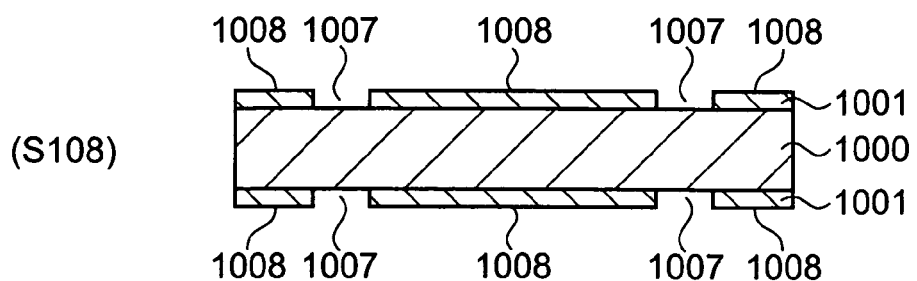

An example of an electrode forming method of a piezoelectric vibrating element will be now described using a process flowchart in FIG. 1. First, a conductive metal thin film 1001, such as gold, silver, chrome, nickel or the like, is formed on the surface of a piezoelectric substrate 1000. The forming of the metal thin film 1001 can be carried out, for example, using vapor deposition or sputtering or the like. Then, a photoresist 1002, for example, is coated on the surface of the metal thin film 1001 (S102).

Next, a mask 1003 composed, for example, of a metal thin film is placed on the surface of the photoresist 1002. A through hole 1004 corresponding to the photosensitive pattern of the photoresist 1002 is formed on the mask 1003. Then, photosensitive light V for the photoresist 1002 is irradiated from above the mask 1003 (S104). Thus, an exposed part 1005 corresponding to the through hole 1004, or the part where the photoresist 1002 is exposed, is formed.

Next, the mask 1003 is removed and a development process is carried out for the photoresist 1002. Then, the exposed part 1005 is removed and a through part 1006 is formed (S106). Next, a chemical etching process is carried out to the piezoelectric substrate 1000 formed in S106. By this etching process, the part, which corresponds to the through part 1006 of the photoresist 1002, of the electrode thin film 1001 is removed. The part from which the electrode thin film 1001 is removed becomes an electrode dividing part 1007, forming each electrode 1008 (S108).

Figure 2:
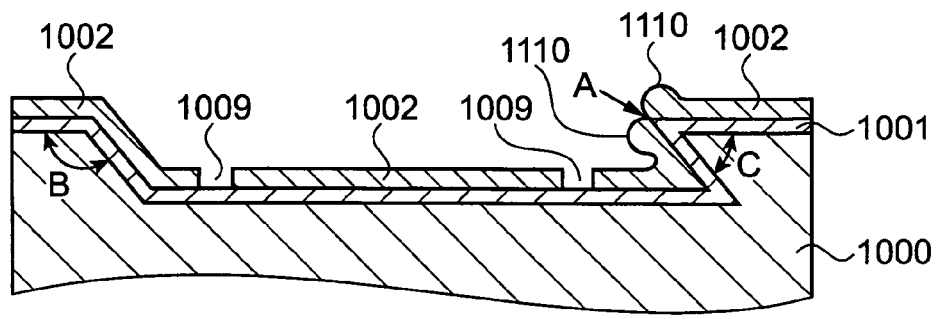
FIG. 2 is sectional view of a piezoelectric vibrating element showing an electrode disconnection on a corner part.

The electrode disconnection on the corner part will now be explained using FIG. 2. FIG. 2 is a sectional view of a piezoelectric vibrating element. As shown in FIG. 2, there is a level difference, on the piezoelectric substrate 1000, between the surface of the center part and the surface of the outer frame unit. The electrode disconnection on the corner part occurs when an electrode is formed on the corner parts having respective angles B and C caused by the level difference. Now, the explanation will be given accordingly to the process. The metal thin film 1001 is formed on the surface of the piezoelectric substrate 1000. An electrode is formed using a photolithography method or the like. First, the surface of the metal thin film 1001 is coated with the photoresist 1002 (S102 in FIG. 1). At this timing, on the corner of the angle B having an obtuse angle, the photoresist 1002 is coated along the corner. In contrast, on the corner of the angle C having an acute angle, the photoresist is drawn bilaterally from the ridgeline of the corner due to the surface tension of the photoresist, forming a resist pool 1110. The resist pool 1110 brings part, on which the photoresist is not coated, on the ridgeline. Further, although it is not shown, on the corner having an acute angle, a part on which the photoresist is not coated may occur since the photoresist is hardly applied to the shadowed area of the corner. Exposure and development and the like are carried out in this situation (S104 and S106 in FIG. 1). Then, a chemical etching is carried out on a through part 1009 (S108 in FIG. 1). This chemical etching causes an electrode disconnection on the corner part. Specifically, the etching solution enters the ridgeline on which the photoresist is not coated, as indicated with the arrowhead A, in concurrence with the forming of an electrode pattern, blowing out the electrode. The electrode disconnection on the corner part occurs due to the blowing out of the electrode.

Piezoelectric vibrating elements and piezoelectric vibrators according to the embodiments of the invention will be described below with reference to the drawings.

First Embodiment

Figure 3A:
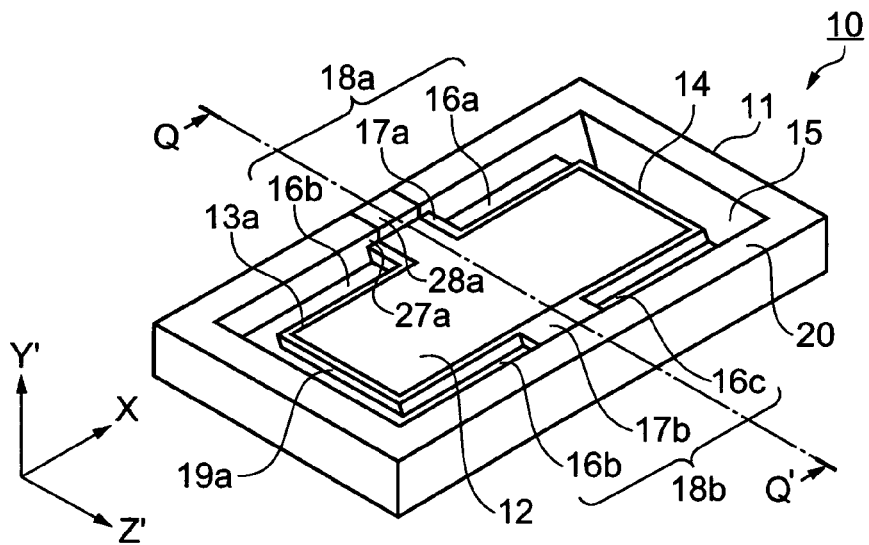
FIG. 3A is a perspective view and FIG. 3B is a front sectional view, both showing the outline structure of a piezoelectric vibrating element according to a first embodiment.

A piezoelectric vibrating element according to a first embodiment of the invention will be now described with reference to the drawings. FIG. 3 shows the outline structure of a piezoelectric vibrating element according to the first embodiment. FIG. 3A is a perspective view and FIG. 3B is a sectional view taking along line Q-Q'.

Figure 3B:
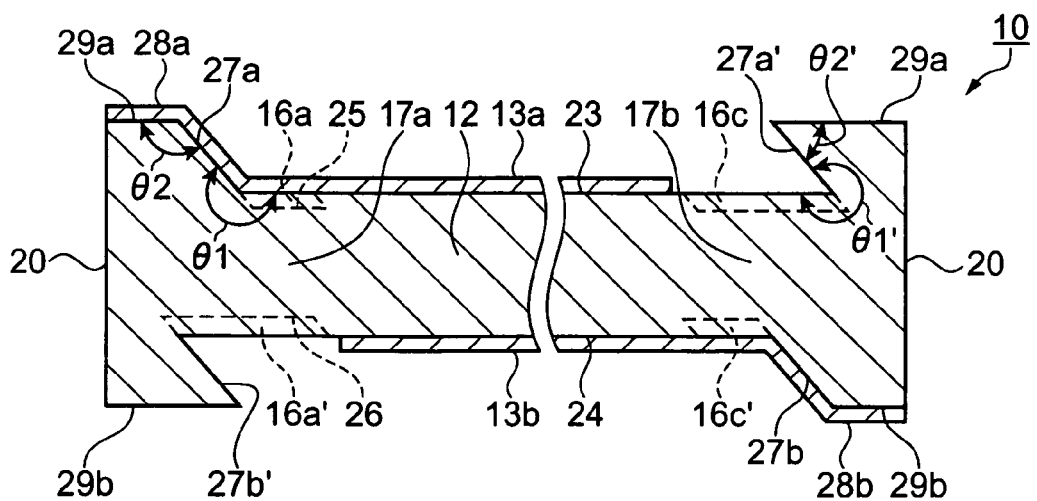

As shown in FIGS. 3A and 3B, the quartz vibrating element 10 as an example of a piezoelectric vibrating element is formed with a quartz substrate 11. The quartz vibrating element 10 includes a main vibrating unit 12, exciting electrodes 13a and 13b that are formed on the top and bottom faces 23 and 24 of the main vibrating unit 12, an outer frame unit 20 that is formed approximately along the periphery of the main vibrating unit 12. The main vibrating unit 12 and the outer frame unit 20 are connected to each other by the connecting units 18a and 18b that are constituted by flat parts 17a and 17b and recesses 16a, 16b and 16c. The exciting electrodes 13a and 13b are connected to connecting electrodes 28a and 28b that are formed in a manner of passing through the top and bottom faces of the flat parts 17a and 17b to the top and bottom faces 29a and 29b of the outer frame unit 20.

The main vibrating unit 12 has a rectangular form, the four ends (four sides) of which are formed with the connecting units 18a and 18b and a through hole 15 that are formed in its surrounding area. The main vibrating unit 12 carries out a thickness shear vibration, in which the X axis direction is a vibrating direction (hereinafter, the vibrating direction is referred to as the X axis direction), when voltage is applied to the exciting electrodes 13a and 13b that are formed on the top and bottom faces 23 and 24 of the main vibrating unit. One end in the X axis direction, which is the vibrating direction of the main vibrating unit 12, is an open end 14, formed as an open end part by the through hole 15. The other ends of the main vibrating unit 12 are connected to the connecting units 18a and 18b. An end face 19a corresponding to the depth of the recesses 16a, 16b and 16c is formed to the part to which the recesses 16a, 16b and 16c are connected. Here, the recesses 16a, 16b and 16c on the top face will be used for the following explanation, although similar recesses 16a', 16b' and 16c' are formed also on the bottom face of the quartz substrate 11 just like on the top face.

The outer frame unit 20 is used for connecting the quartz vibrating element 10 with other supporting member such as a circuit board or the like (not shown), or with a cover body that protects the main vibrating unit 12 (not shown) or the like. The top and bottom faces 29a and 29b of the outer frame unit 20 are formed outside (or in the opposite direction from the center) the top and bottom faces 23 and 24 of the main vibrating unit 12 and the top and bottom faces of the connecting units 18a and 18b, in terms of thickness direction, with a level difference.

Next, the above-mentioned level difference will be explained. The outer shape of the quartz vibrating element 10 is formed, for example, using a blast process in which grains are sprayed together with pressured gas or a chemical etching process using photolithography technique and the like. In the first embodiment, an example is shown in which a chemical etching process is used for making a level difference between the main vibrating unit 12 and the outer frame unit 20. In the chemical etching process, the quartz substrate 11, in which the areas on the quartz substrate 11 to be processed (in this example, the main vibrating unit 12 and the flat parts 17a and 17b) are exposed by a mask process, is immersed in an etching solution. The chemical etching process has a so-called etching rate, which shows the speed at which the etching proceeds in a certain period of time, and the rate differs depending on the crystallographic axes direction of the quartz crystal. The etching rate is large particularly in the Y axis direction while is relatively small in the X axis direction. Therefore, the etching proceeds more quickly in the Y axis direction. Thus, the etching faces 27a, 27b, 27a' and 27b' (hereinafter, simply referred to as a connecting face), which are formed between the top and bottom faces 29a and 29b of the outer frame unit 20 and the top and bottom faces of the flat parts 17a and 17b, are formed approximately along the Y axis. Because the Y axis has an inclination of about 35 degrees to the top and bottom faces 29a and 29b, which extend in the X axis direction, of the outer frame unit 20, as mentioned above, the connecting faces 27a, 27b, 27a' and 27b' are also formed with the same inclination. Therefore, the angle θ1 made by the connecting faces 27a and 27b on one side and the top and bottom faces of the flat parts 17a and 17b is about 235 degrees, according to the equation θ1=180°+(90°−35°). The angle θ2 made by the connecting faces 27a and 27b and the top and bottom faces 29a and 29b of the flat parts is about 125 degrees, according to the equation θ2=180°−(90°−35°). In the same way, the angle θ1' made by the connecting faces 27a' and 27b' on the other side and the top and bottom faces of the flat parts 17a' and 17b' is about 305 degrees. The angle θ2' made by the connecting faces 27a' and 27b' and the top and bottom faces 29a and 29b of the outer frame unit 20 is about 55 degrees.

The connecting electrode 28a on the top face is formed on the side in which the angle θ1 is about 235 degrees in the range of 90°<θ1<270° and the angle θ2 is about 125 degrees in the range of 90°<θ2≦180°. Specifically, the connecting electrode 28a is formed in a manner of starting from the exciting electrode 13a, passing through the top face of the flat part 17a in which the angles θ1 and θ2 satisfy the above-mentioned requirements, and passing further through the connecting face 27a to reach the top face 29a of the outer frame unit 20. The connecting electrode 28b on the bottom face is formed on the side in which θ1, just like the connecting electrode 28a on the top face, is about 235 degrees in the range of 90°<θ1<270°, and the side in which the angle θ2 is about 125 degrees in the range of 90°<θ2≦180°. Specifically, the connecting electrode 28b on the bottom face is formed in a manner of starting from the exciting electrode 13b, passing through the bottom face of the flat part 17b in which the angles θ1 and θ2 satisfy the above-mentioned requirements, and passing further through the connecting face 27b to reach the bottom face 29b of the outer frame unit 20. Here, as long as the angle θ1 is within the range of 90°<θ1<270° and the angle θ2 is within the range of 90°<θ2≦180°, the angle made by the connecting faces 27a and 27b on the top face of the substrate and the top and bottom faces of the flat parts 17a and 17b, as well as the angle made by the connecting faces 27a and 27b and the top and bottom faces 29a and 29b of the outer frame unit 20, becomes an obtuse angle.

The connecting units 18a and 18b are composed of the concave recesses 16a, 16b and 16c, which have bottom faces 25 and 26, and the flat parts 17a and 17b placed on the same surface with the top and bottom faces 23 and 24 of the main vibrating unit 12. The flat parts 17a and 17b are placed approximately at the center of the two sides that are located along the X axis direction of the main vibrating unit 12. The recesses 16a, 16b and 16c, having a depth of about a few μm (for example, 2 μm), are connected to the flat parts 17a and 17b and are extended in the X axis direction of the main vibrating unit 12. Among the recesses 16a, 16b and 16c, the recesses 16a and 16c that are formed in the direction where the through hole 15 is formed are placed between each of the flat parts 17a and 17b and the through hole 15. Further, among the recesses 16a, 16b and 16c, the recess 16b formed in the opposite direction from the through hole 15 is extended from the flat part 17a, and then bended from the X axis direction to the Z' axis direction along the periphery of the main vibrating unit 12, and further returned to the X axis direction to be connected to the flat part 17b.

The recesses 16a, 16b and 16c are used to enlarge the shape of the connecting units 18a and 18b to improve its intensity while preventing the degradation of the vibrating properties due to the propagation of the vibration from the main vibrating unit 12 to the outer frame unit 20. Now, the propagation of the vibration of the quartz vibrating element 10 of the AT cut will be explained.

As for the thickness shear vibration, which is a main vibration of the quartz vibrating element 10 of the AT cut, the alignment of the exciting electrodes and the like is predetermined so that the center part of the main vibrating unit 12 may vibrate. The thickness shear vibration on the center part is propagated to the periphery part of the vibrating element (in this example, to the outer frame unit 20).

The quartz vibrating element 10 is often hold in a manner that the outer frame unit 20 is attached to a supporting member, which restrains the vibration propagated to the outer frame unit 20. The restraint of the propagated vibration affects the thickness shear vibration, which is a main vibration, resulting in the crystal impedance (hereinafter, simply referred to as "CI value") to lower or induce other vibrating modes, which deteriorates the stability of the oscillation frequency.

The propagation of the vibration is expressed by the equations 1 to 4. According to the equations 1 to 4, when there are areas with different frequencies on the same vibrating element, the propagation of the vibration occurs from the high frequency to the low frequency, while the vibration is attenuated from the low frequency to the high frequency according to the propagation distance, because $\alpha$ and $\beta$ are imaginary numbers.

In this way, the forming of the recesses 16a, 16b and 16c makes it possible to enlarge the connecting area of the connecting units 18a and 18b to improve its intensity of the connecting parts 18a and 18b while restraining the propagation of the thickness shear vibration to the outer frame unit 20.

Equation 1

$$U = B \cdot \exp[-j(\omega t - (\alpha x + \beta z))] \quad (1)$$

Equation 2

$$\alpha x = \left(\frac{\pi x}{2b}\right)\left(\frac{\gamma_{11}}{C_{66}} + \frac{\pi^2}{12}\right)^{-\frac{1}{2}}\left[\left(\frac{\omega}{\omega_s}\right)^2 - 1\right]^{\frac{1}{2}} \quad (2)$$

Equation 3

$$\gamma_{11} = \frac{s_{33}}{s_{11}s_{33} - s_{13}^2} \quad (3)$$

Equation 4

$$\beta z = \left(\frac{\pi z}{2b}\right)\left(\frac{C_{66}}{C_{55}}\right)^{\frac{1}{2}}\left[\left(\frac{\omega}{\omega_s}\right)^2 - 1\right]^{\frac{1}{2}} \quad (4)$$

where U: displacement of the thickness shear vibration in the X direction and in the Z direction; B: amplitude intensity; $\omega, \omega_s$: angular frequency of a vibrator and a vibrating element; $\alpha, \beta$: propagation coefficient in the X direction and in the Z direction; $C_{55}, C_{66}$: elasticity stiffness; $S_{11}, S_{12}, S_{13}$: elasticity compliance; 2a: length of the main vibrating unit in the X axis direction; 2b: thickness of the main vibrating unit in the Y' axis direction; 2c: width of the main vibrating unit in the Z' axis direction.

According to the first embodiment, the connecting electrode 28a is formed on the side in which the angle θ1 made by the connecting face 27a and the top face 23 of the main vibrating unit 12 is 125 degrees and the side in which the angle θ2 made by the connecting face 27a and the top face 29a of the outer frame unit 20 is 145 degrees. In this way, the connecting electrode 28a is formed on the side where each corner has an obtuse angle. Thus, phenomena such as that the photoresist is drawn bilaterally from the corner part or that the photoresist is not applied due to the shadow of the corner part can be prevented. Therefore, the blowing out of the electrode on the corner part does not occur even if chemical etching is carried out for forming the connecting electrode 28a and the like, because the corner part is covered with the photoresist. Thus, the disadvantage in that the conduction of the connecting electrodes 28a is disconnected due to the blowing out, or the so-called electrode disconnection, can be prevented.

In the quartz vibrating element 10, the connecting units 18a and 18b are composed of the recesses 16a, 16b and 16c that are concave to the top and bottom faces 29a and 29b of the outer frame unit 20 and the flat parts 17a and 17b that are on the same surface with the top and bottom faces 23 and 24 of the main vibrating unit 12. Forming, in this way, the flat parts 17a and 17b on the same surface with the top and bottom faces 23 and 24 of the main vibrating unit 12, in the connecting units 18a and 18b, can prevent the stress concentration due to impact or the like. Further, forming the concave recesses 16a, 16b and 16c in conjunction with the flat parts 17a and 17b allows the length of the connecting units 18a and 18b to be enlarged. Thus, the intensity of the connecting parts 18a and 18b can be improved. Accordingly, the damage on the connecting units 18a and 18b due to external impact or the like can be prevented.

Further, by making one end of the main vibrating unit 12 in the X axis direction the open end 14, the effect of the stress due to the difference of the thermal expansion coefficient between the main vibrating unit 12 and the cover body bonded to the outer frame unit 20 and the like can be reduced. In a case where the open end 14 is not placed in the X axis direction of the main vibrating unit 12, the frequency-temperature characteristic is degraded, for example, in a way that the characteristic becomes approximately linear due to the influence of the stress. By forming the open end 14, however, makes it possible to obtain a frequency-temperature characteristic with a cubic curve, which is the proper frequency-temperature characteristic of an AT cut quartz vibrating element. Now, this will be explained below.

The main vibration of thickness slip vibrating element is expressed by Equation 5. Formula 6 is generally satisfied in Equation 5. When the temperature of the piezoelectric vibrating element changes, deformations with different amounts are induced due to the difference between the thermal expansion coefficient of the quartz crystal constituting the main vibrating unit and the thermal expansion coefficient of the cover body or the like, which is bonded to the outer frame unit connected with the main vibrating unit and is made of a different material. An example of a thermal expansion coefficient is: the X axis of the AT cut crystal: $19.7 \times 10^{-6}/°$ C., the Z' axis of the AT cut crystal: $12.8 \times 10^{-6}/°$ C., the borosilicate glass used for the cover body: $3.25 \times 10^{-6}/°$ C. The stress is added to the main vibrating unit due to the difference of the deformation amounts. The slight change in the constant numbers in Equation 5 and Formula 6 due to the influence of the stress changes the frequency, which degrades the so-called frequency-temperature characteristic, which is the frequency characteristic according to the temperature change, of a quartz vibrating element.

According to Equation 5 and Formula 6, the thickness of the vibrating element $2b$, the length of the vibrating element in the X axis direction $2a$, the elastic constants $C_{66}$ and $C_{11}$, and the density of the quartz crystal $\rho$ are all material constants that depend on the temperature. Here, the elastic constants $C_{66}$ and $C_{11}$ and the density of the quartz crystal $\rho$ are constants inherent to the materials, which means that these constants are not affected by the heat deformation due to the shape of the vibrating element. Further, the thickness of the vibrating element $2b$ is not affected by the heat deformation because the sides of the vibrating element are opened in the thickness direction. The length of the vibrating element in the X axis direction $2a$ has an influence on the main vibration, interfering with the connected outer frame unit by the dimension change according to the temperature change. In the case where the both ends of the main vibrating unit in the X axis direction are connected to the outer frame unit, in particular, the influence becomes larger because the dimension change can not be released. Therefore, opening at least one end of the main vibrating unit in the X axis direction makes it possible to release the dimension change according to the temperature change. Thus, the degradation of the frequency-temperature characteristic can be prevented.

Equation 5 (5)

$$f_{(1,1,0)} = \frac{1}{2 \cdot 2b} \sqrt{\frac{C_{66}}{\rho}} \left[1 + \frac{1}{2}\frac{C_{11}}{C_{66}}\left(\frac{b}{a}\right)^2\right]$$

Formula 6 (6)

$$\frac{1}{2}\frac{C_{11}}{C_{66}}\left(\frac{b}{a}\right)^2 \ll 1$$

where $f(1,1,0)$: main vibration frequency of the limited flat plate; $C_{66}$, $C_{11}$: elastic constant; $\rho$: density of the quartz crystal; $2a$: length of the vibrating element in the X axis direction; $2b$: thickness of the vibrating element The quartz vibrating element 10 according to the first embodiment can prevent the electrode disconnection of the connecting electrodes or the like on the corner part of the vibrating element while improve the shock resistance in the case of dropping and the like. Moreover, a stable vibration can be carried out even in the case of temperature change. Specifically, a quartz vibrating element that prevents the electrode disconnection, having high shock resistance as well as good frequency-temperature characteristics can be provided.

Modified example

Figure 4:
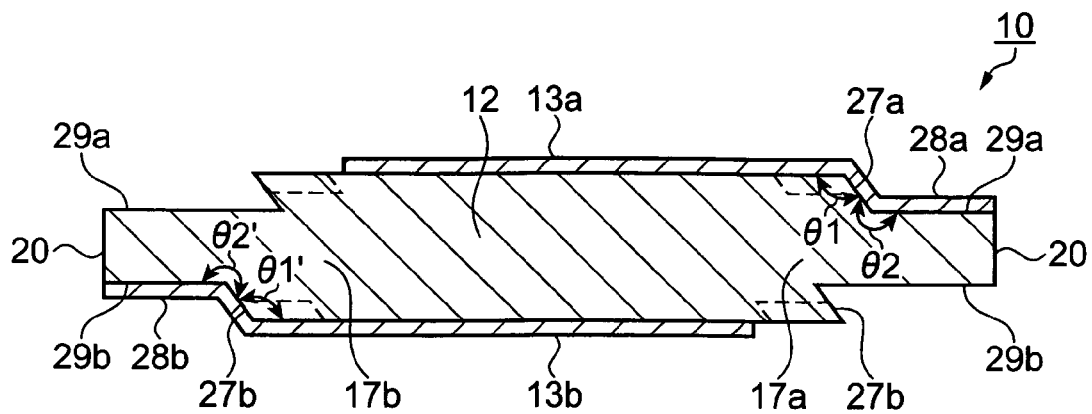
FIG. 4 is a front sectional view showing the outline structure of a modified example of a piezoelectric vibrating element.

Here, a modified example of the first embodiment will be explained with reference to FIG. 4. FIG. 4 is a front sectional view showing the outline structure of a piezoelectric vibrating element of a modified example of the first embodiment. Here, the explanation will not be given about the same structure as in the first embodiment.

As shown in FIG. 4, a quartz vibrating element 10 as an example of a piezoelectric vibrating element includes a main vibrating unit 12, exciting electrodes 13a and 13b that are formed on the top and bottom faces of the main vibrating unit 12, and an outer frame unit 20 that is formed approximately along the periphery of the main vibrating unit 12. The main vibrating unit 12 and the outer frame unit 20 are connected to each other by a connecting unit (not shown) composed of flat parts 17a and 17b and recesses (not shown). The exciting electrodes 13a and 13b are connected to connecting electrodes 28a and 28b that are formed in a manner of passing through the top and bottom faces of the flat parts 17a and 17b to the top and bottom faces 29a and 29b of the outer frame unit 20.

The outer frame unit 20 is used for connecting the quartz vibrating element 10 with other a supporting member such as a circuit board or the like (not shown), or with a cover body that protects the main vibrating unit 12 (not shown) or the like. The top and bottom faces 29a and 29b of the outer frame unit 20 are formed so as to be closer to the center side, in terms of thickness direction, than the top and bottom faces of the main vibrating unit 12 and the top and bottom faces of the connecting units with a level difference. For making a level difference between the main vibrating unit 12 and the outer frame unit 20, a chemical etching process can be used just as in the first embodiment. In the chemical etching process, the quartz substrate 11, in which the area to be processed (in this modified example, the outer frame unit 20) is exposed by a mask process, is immersed in an etching solution. Connecting faces 27a and 27b having the same inclination as in the first embodiment are formed by this etching process.

The connecting electrode 28a on the top face, just as in the first embodiment, is formed passing through the connecting face 27a on the side in which the angle θ1 is within the range of 90°<θ1<270° while the angle θ2 is within the range of 90°<θ2≦180°. Specifically, the connecting electrode 28a is formed in a manner of starting from the exciting electrode 13a, passing through the top face of the flat part 17a on the side in which the angles θ1 and θ2 satisfy the above-mentioned requirements, and passing further through the connecting face 27a to reach the top face 29a of the outer frame unit 20. In the same way, the connecting electrode 28b on the bottom face is formed passing through the connecting face 27b on the side in which the angle θ1 is within the range of 90°<θ1<270° while the angle θ2 is within the range of 90°<θ2≦180°. Specifically, the connecting electrode 28b on the bottom face is formed in a manner of starting from the exciting electrode 13b, passing through the bottom face of the flat part 17b on the side in which the angles θ1 and θ2 satisfy the above-mentioned requirements, and passing further through the connecting face 27b to reach the bottom face 29b of the outer frame unit 20.

The quartz vibrating element 10 according to the modified example, just like the first embodiment, can prevent the electrode disconnection of the connecting electrodes or the like on the corner part of the vibrating element and also improve the shock resistance in the case of dropping and the like. Moreover, a stable vibration can be carried out even in the case of temperature change. Specifically, a quartz vibrating element can be provided that prevents the electrode disconnection and has high shock resistance as well as good frequency-temperature characteristics.

Second Embodiment

Figure 5A:
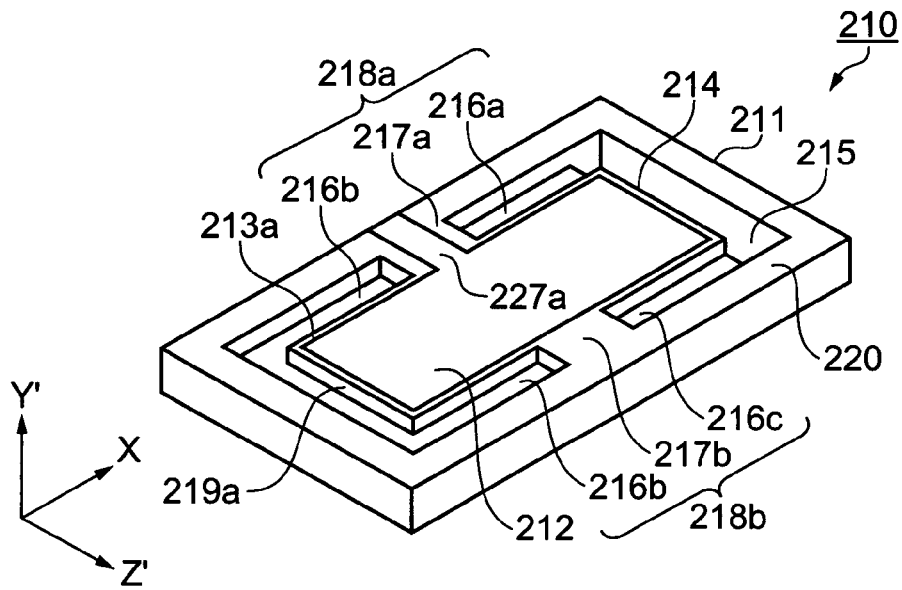
FIG. 5A is a perspective view and FIG. 5B is a front sectional view, both showing the outline structure of a piezoelectric vibrating element according to a second embodiment.
Figure 5B:
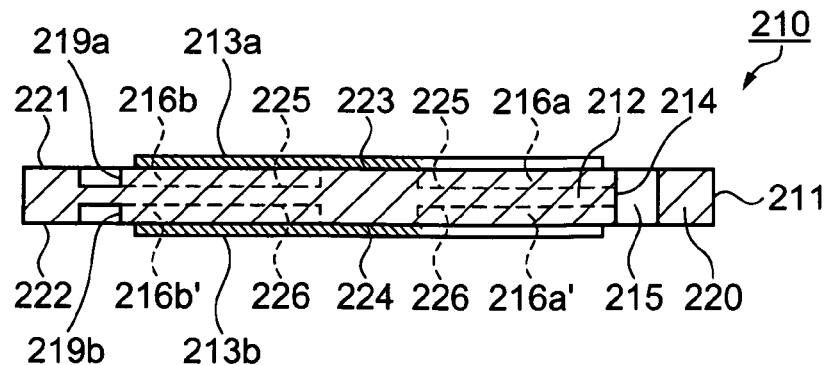

A piezoelectric vibrating element according to a second embodiment of the invention will be now described with reference to FIG. 5. FIG. 5 shows the outline structure of the piezoelectric vibrating element according to the second embodiment. FIG. 5A is a perspective view and FIG. 5B is a front sectional view. The second embodiment will be described below in detail, although the same explanation as in the first embodiment will not be given.

As shown in FIG. 5, the quartz vibrating element 210 as an example of a piezoelectric vibrating element is composed of a quartz substrate 211. The quartz vibrating element 210 includes a main vibrating unit 212, exciting electrodes 213a and 213b that are formed on the top and bottom faces 223 and 224 of the main vibrating unit 212, and an outer frame unit 220 that is formed approximately along the periphery of the main vibrating unit 212. The main vibrating unit 212 and the outer frame unit 220 are connected to each other by the connecting units 218a and 218b that are constituted by flat parts 217a and 217b and recesses 216a, 126b and 216c. The exciting electrode 213a on the top face is connected to a connecting electrode 227a on the top face that is formed in a manner of passing through the top face of the flat part 217a to reach the top face 221 of the outer frame unit 220. In the same way, the exciting electrode 213b on the bottom face is connected to a connecting electrode (not shown) formed in a manner of reaching the top face 221 of the outer frame unit 220.

The main vibrating unit 212 has a rectangular form, the four ends (four sides) of which are formed with the connecting units 218a and 218b and the through hole 215 formed in the surrounding area. The main vibrating unit 212 carries out a thickness shear vibration, in which the X axis direction is a vibrating direction (hereinafter, the vibrating direction is referred to as the X axis direction), when voltage is applied to the exciting electrodes 213a and 213b that are formed on the top and bottom faces 223 and 224 of the main vibrating unit. One end in the X axis direction, which is the vibrating direction of the main vibrating unit 212, is an open end 214, formed as an open end part by the through hole 215. The other ends of the main vibrating unit 212 are connected to the connecting units 218a and 218b. End faces 219a and 219b corresponding to the depth of the recesses 16a, 16b and 16c are formed to the part to which the recesses 216a, 216b and 216c are connected. Here, the recesses 216a, 216b and 216c on the top face will be used for the following explanation, although similar recesses 216a', 216b' and 216c' (216c' is not shown) are formed also on the bottom face of the quartz substrate 211 just like on the top face.

The outer frame unit 220 is used for connecting the quartz vibrating element 210 with other supporting members such as a circuit board or the like (not shown), or with a cover body that protects the main vibrating unit 212 (not shown) or the like. The top and bottom faces 221 and 222 of the outer frame unit 220 are formed approximately on the same surface with the top and bottom faces of the flat parts 217a and 217b, and with the top and bottom faces 223 and 224 of the main vibrating unit 212.

The connecting units 218a and 218b are composed of the concave recesses 216a, 216b and 216c, having bottom faces 225 and 226, and the flat parts 217a and 217b placed on the same surface with the top and bottom faces 223 and 224 of the main vibrating unit 212 and with the top and bottom faces 221 and 222 of the outer frame unit 220. The flat parts 217a and 217b are placed approximately at the center of the two sides that are located along the X axis direction of the main vibrating unit 212. The recesses 216a, 216b and 216c, having a depth of about a few μm (for example, 2 μm), are connected to the flat parts 217a and 217b and are extended in the X axis direction of the main vibrating unit 212. Among the recesses 216a, 216b and 216c, the recesses 216a and 216c that are formed in the direction in which the through hole 215 is formed are placed between each of the flat parts 217a and 217b and the through hole 215. Further, among the recesses 216a, 216b and 216c, the recess 216b formed in the opposite direction from the through hole 215 is extended from the flat part 217a, and then bended from the X axis direction to the Z' axis direction along the periphery of the main vibrating unit 212, and further returned to the X axis direction to be connected to the flat part 217b.

The connecting electrode 227a on the top face is formed in a manner of starting from the exciting electrode 213a, passing through the top face of the flat part 217a to reach the surface 221 of the outer frame unit 220. In the same way, the connecting electrode on the bottom face is also formed although it is not shown. In this way, the connecting electrode 227a is formed on the same surface without a level difference.

The relation between the top face of the flat part 217a and the top face of the outer frame unit 220 in the second embodiment is that in the case in which the angles θ1 and θ2, the explanation for which is given in the first embodiment using FIG. 3B, are 180 degrees.

According to the second embodiment, the connecting electrode 227a is formed on a flat surface without a level difference. Therefore, there is no corner part, which would cause an electrode disconnection, in the forming area of the connecting electrode 227a, which can prevent the electrode disconnection. Thus, the quartz vibrating element 210 according to the second embodiment can prevent the electrode disconnection of the connecting electrodes or the like of the vibrating element while improve the shock resistance in the case of dropping or the like. Moreover, a stable vibration can be carried out even in the case of temperature change. Specifically, a quartz vibrating element can be provided that prevents the electrode disconnection and has high shock resistance as well as good frequency-temperature characteristics.

Third Embodiment

Figure 6A:
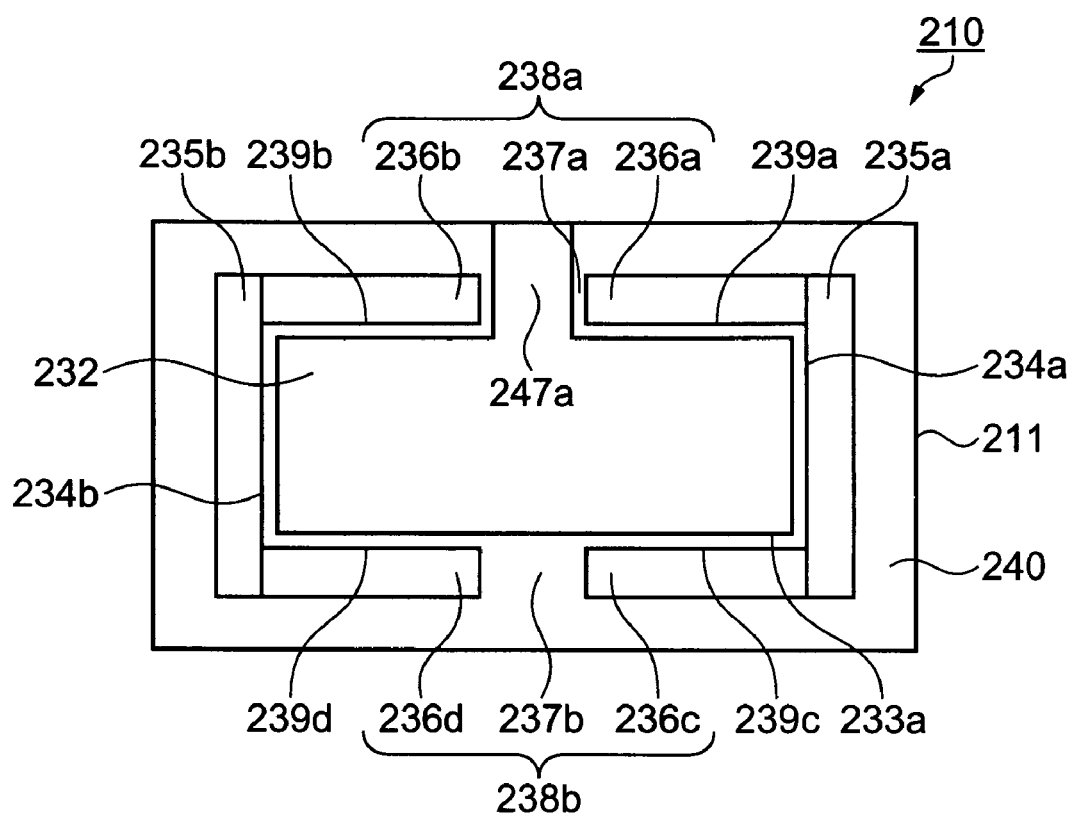
FIG. 6A is a plan view and FIG. 6B is a front sectional view, both showing the outline structure of a piezoelectric vibrating element according to a third embodiment.
Figure 6B:
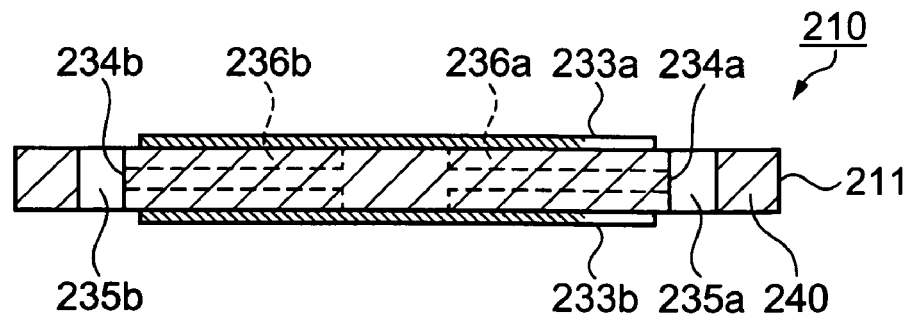

A piezoelectric vibrating element according to a third embodiment of the invention will be now described with reference to FIG. 6. FIG. 6 shows the outline structure of the piezoelectric vibrating element according to the third embodiment. FIG. 6A is a plan view and FIG. 6B is a front sectional view.

The quartz vibrating element 210 as an example of a piezoelectric vibrating element is composed of a quartz substrate 211. The quartz vibrating element 210 includes a main vibrating unit 232, exciting electrodes 233a and 233b that are formed on the top and bottom faces of the main vibrating unit 232, and an outer frame unit 240 that is formed approximately along the periphery of the main vibrating unit 232. The main vibrating unit 232 and the outer frame unit 240 are connected to each other by the connecting units 238a and 238b that are constituted by flat parts 237a and 237b and recesses 236a, 236b, 236c and 236d. The exciting electrodes 233a and 233b are connected to a connecting electrode 247a that is formed in a manner of passing through the top and bottom faces of the flat parts 237a and 237b to reach the top and bottom faces of the outer frame unit 240. The connecting electrode on the bottom face is not shown.

The main vibrating unit 232 has a rectangular form, the four ends (four sides) of which are formed with the connecting units 238a and 238b and two through holes 235a and 235b formed in the surrounding area. The main vibrating unit 232 carries out a thickness shear vibration, in which the X axis direction is a vibrating direction (hereinafter, the vibrating direction is referred to as the X axis direction), when voltage is applied to the exciting electrodes 233a and 233b that are formed on the top and bottom faces of the main vibrating unit. One end in the X axis direction, which is the vibrating direction of the main vibrating unit 232, is an open end 234a, formed as an open end part by the through hole 235. Another end that is formed on the opposite side of the open end 234a of the main vibrating unit 232 in the X axis direction is also formed as an open end 234b by the through hole 235b, just like the open end 234a. The other ends than the open ends 234a and 234b of the main vibrating unit 232 are connected to the connecting units 238a and 238b. End faces 239a, 239b, 239c and 239d corresponding to the depth of the recesses 236a, 236b, 236c and 236d are formed to the part to which the recesses 236a, 236b, 236c and 236d are connected.

The connecting units 238a and 238b are composed of the concave recesses 236a, 236b, 236c and 236d, and the flat parts 237a and 237b placed on the same surface with the top and bottom faces of the main vibrating unit 232 and with the top and bottom faces of the outer frame unit 240. The flat parts 237a and 237b are placed approximately at the center of the two sides that are located along the X axis direction of the main vibrating unit 232. The recesses 236a, 236b, 236c and 236d, having a depth of about a few μm (for example, 2 μm), are connected to the flat parts 237a and 237b and are extended in the X axis direction of the main vibrating unit 232. The recesses 236a, 236b, 236c and 216d are placed between the flat parts 237a and 237b and the through holes 235a and 235b, respectively.

According to the third embodiment, because the open ends 234a and 234b are placed on the both ends of the main vibrating unit 232, in addition to the open end in the first embodiment and the second embodiment, the expansion and contraction of the main vibrating unit 232 and of the outer frame unit 240 due to temperature change can be absorbed on the both ends in the vibrating direction. Thus, the stress added to the main vibrating unit 232 can be reduced, which can further lower the influence to the vibrating properties.

Fourth Embodiment

Figure 7A:
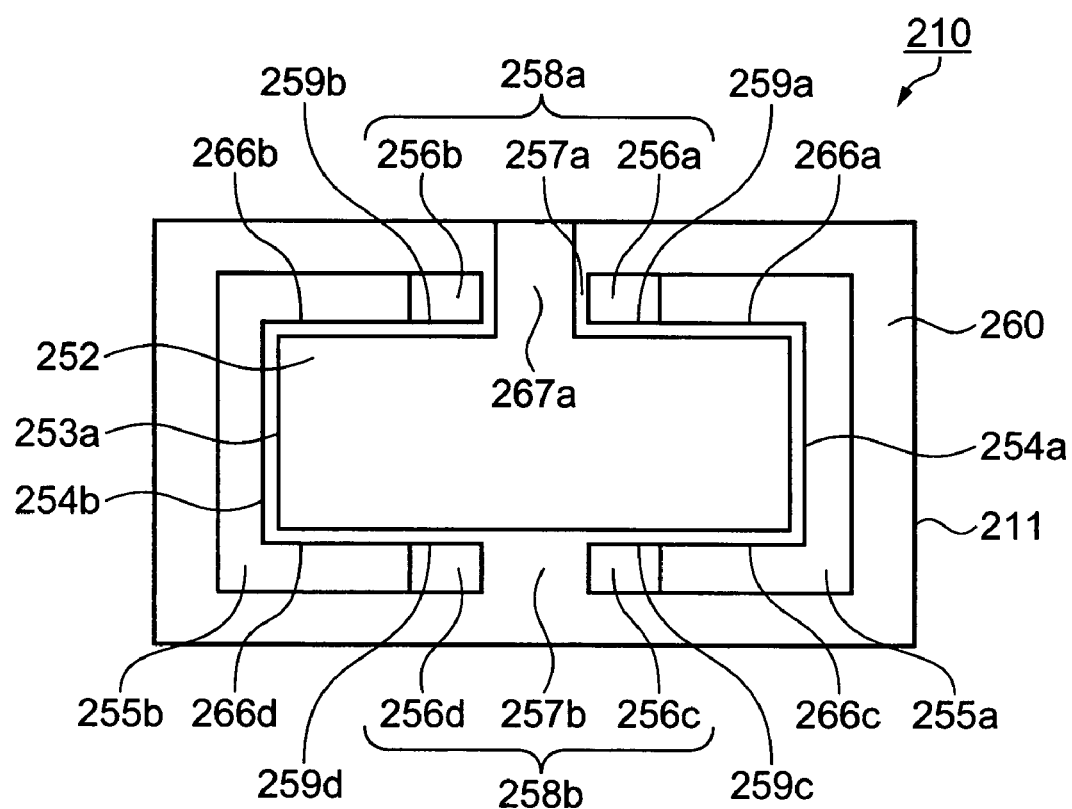
FIG. 7A is a plan view and FIG. 7B is a front sectional view, both showing the outline structure of a piezoelectric vibrating element according to a fourth embodiment.

A piezoelectric vibrating element according to a fourth embodiment of the invention will be now described with reference to FIG. 7. FIG. 7 shows the outline structure of the piezoelectric vibrating element according to the fourth embodiment. FIG. 7A is a plan view and FIG. 7B is a front sectional view.

Figure 7B:
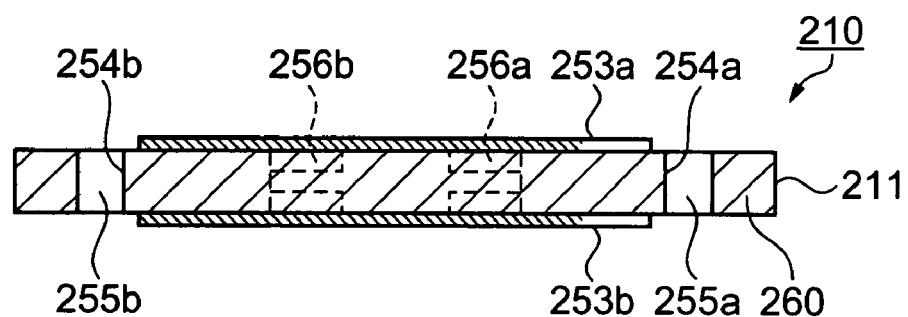

As shown in FIGS. 7A and 7B, the quartz vibrating element 210 as an example of a piezoelectric vibrating element includes a main vibrating unit 252, exciting electrodes 253a and 253b that are formed on the top and bottom faces of the main vibrating unit 252, and an outer frame unit 260 that is formed approximately along the periphery of the main vibrating unit 252. The main vibrating unit 252 and the outer frame unit 260 are connected to each other by the connecting units 258a and 258b that are constituted by flat parts 257a and 257b and recesses 256a, 256b, 256c and 256d. The exciting electrodes 253a and 253b are connected to a connecting electrode 267a that is formed in a manner of passing through the top and bottom faces of the flat parts 257a and 257b to reach the top and bottom faces of the outer frame unit 260. The connecting electrode on the bottom face is not shown.

The main vibrating unit 252 has a rectangular form, the four ends (four sides) of which are formed with the connecting units 258a and 258b and two through holes 255a and 255b formed in the surrounding area. The main vibrating unit 252 carries out a thickness shear vibration, in which the X axis direction is a vibrating direction (hereinafter, the vibrating direction is referred to as the X axis direction), when voltage is applied to the exciting electrodes 253a and 253b that are formed on the top and bottom faces of the main vibrating unit. The both ends in the X axis direction, which is the vibrating direction of the main vibrating unit 252, are the open ends 254a and 254b, formed as an open end part by the through holes 255a and 255b. The through holes 255a and 255b form a so-called U-shape, which form the open end parts 254a and 254b of the main vibrating unit 252 and extend to the periphery of the main vibrating unit 252 in the width direction (in the Z' direction). The other ends than the open ends 254a and 254b of the main vibrating unit 252 are composed of the end faces 259a, 259b, 259c and 259d that are connected to the connecting units 258a and 258b, and the parts 266a, 266b, 266c and 266d that are opened by the through holes 255a and 255b.

The connecting units 258a and 258b are composed of the concave recesses 256a, 256b, 256c and 256d and the flat parts 257a and 257b placed on the same surface with the top and bottom faces of the main vibrating unit 252 and the top and bottom faces of the outer frame unit 260. The flat parts 257a and 257b are placed approximately at the center of the two sides that are located along the X axis direction of the main vibrating unit 252. The recesses 256a, 256b, 256c and 256d, having a depth of about a few μm (for example, 2 μm), are connected to the flat parts 257a and 257b and are extended in the X axis direction of the main vibrating unit 252.

According to the fourth embodiment, the electrode disconnection of the connecting electrodes or the like of the vibrating element can be prevented while the shock resistance in the case of dropping or the like can be improved. Moreover, a stable vibration can be carried out even in the case of temperature change. Specifically, a quartz vibrating element can be provided that prevents the electrode disconnection and has high shock resistance as well as good frequency-temperature characteristics.

Although each shape of the through holes and of the connecting units shown as an example in the first to the fourth embodiments has a symmetric shape, the center of which corresponds to the center of the main vibrating unit, it is not necessarily required to be a symmetric shape. It is acceptable even if a different shape is formed at each end.

Figure 8:
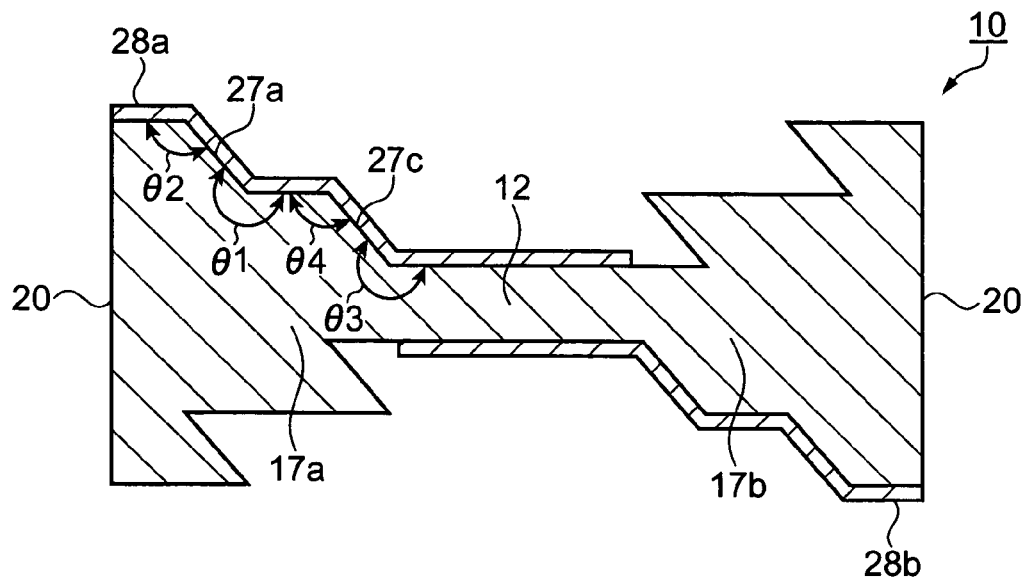
FIG. 8 is a front sectional view showing the outline structure of a piezoelectric vibrating element as an applied example.

Further, although the surface of the main vibrating unit and the surface of the flat part constituting the connecting unit are placed on the same surface in the examples used in the first to the fourth embodiments, it is not limited to such. For example, as shown in FIG. 8, a configuration in which a connecting face 27*c* is formed between the surface of the main vibrating unit 12 and the surface of the flat parts 17*a* and 17*b* with a level difference and a connecting face 27*a* is formed between the surface of the flat parts 17*a* and 17*b* and the surface of the outer frame unit 20 with a level difference is also acceptable. In this case, just like in the above-mentioned embodiments, the connecting electrode 28*a* on the surface is formed on the side where the angle made by the connecting face and the flat surface of the main vibrating unit 12, and the angle made by the top face of the flat parts and the top face of the outer frame unit are within the above-mentioned range. The connecting electrode 28*b* on the bottom face is formed in the same configuration as the top face.

Fifth Embodiment

Figure 9:
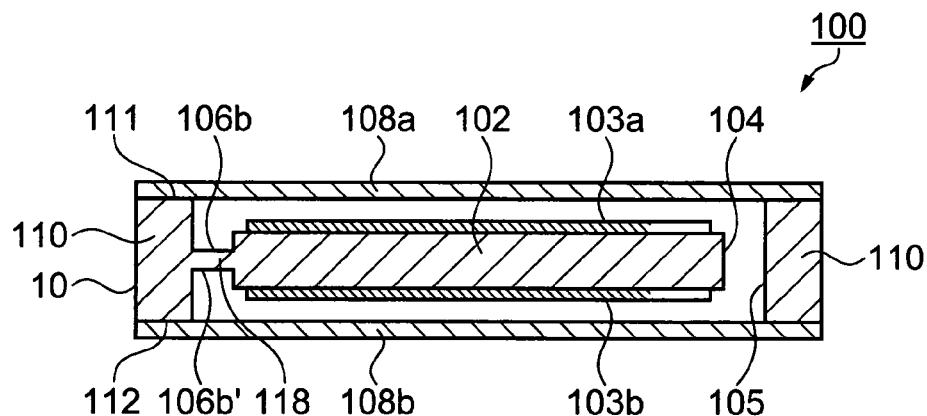
FIG. 9 is a front sectional view showing the outline structure of a quartz vibrator according to a fifth embodiment.

A piezoelectric vibrator according to a fifth embodiment of the invention will be now described with reference to FIG. 9. FIG. 9 is a front sectional view showing the outline structure of a quartz vibrator according to the fifth embodiment.

As shown in FIG. 9, the quartz vibrator 100 as an example of a piezoelectric vibrator according to the second aspect of the invention is composed of a quartz vibrating element 10 explained in the first embodiment and cover bodies 108*a* and 108*b* that are attached to the top and bottom faces 111 and 112 of the outer frame unit 110 of the quartz vibrating element 10. The connecting electrodes are formed just like in the first embodiment, although they are not shown.

The quartz vibrating element 10 is composed of a main vibrating unit 102, exciting electrodes 103*a* and 103*b* that are formed on the top and bottom faces of the main vibrating unit 102, an outer frame unit 110 that is formed approximately along the periphery of the main vibrating unit 102, and a connecting unit 118 that connects the main vibrating unit 102 and the outer frame unit 110.

The main vibrating unit 102 has a rectangular form, the four ends (four sides) of which are formed with the connecting unit 118 and the through hole 105 formed in the surrounding area. At least one end of the X axis direction, which is the vibrating direction of the main vibrating unit 102, is an open end 104, formed as an open end part by the through hole 105. The other end of the main vibrating unit 102 is connected to the connecting unit 118 that is constituted by the recesses 106*b* and 106*b*' and the flat part (not shown).

The top and bottom faces 111 and 112 of the outer frame unit 110 are placed outside in terms of thickness direction (or in the opposite direction from the center) from the parts that constitute the quartz vibrating element 10, excluding the outer frame unit 110. The outer frame unit 110 and the main vibrating unit 102 are connected integrally by the connecting unit 118.

Borosilicate glass is used for the cover bodies 108*a* and 108*b*. The cover bodies 108*a* and 108*b* are bonded in an airtight way to the top and bottom faces 111 and 112 of the outer frame unit 110 of the quartz vibrating element 10, using a process such as anode bonding or the like. Here, because the top and bottom faces 111 and 112 of the outer frame unit 110 are placed outside of the other sides in terms of thickness direction, the contact of the cover bodies 108*a* and 108*b* with the main vibrating unit 102 and with the connecting unit 118 can be prevented.

According to the fifth embodiment, a quartz vibrating element is housed in an airtight way, that prevents the electrode disconnection, has high shock resistance as well as vibrating properties of which are not degraded much even in the case of temperature change. Thus, the degradation of the vibrating properties due to the electrode disconnection can be prevented and a quartz vibrating element with high shock resistance and with good frequency-temperature characteristics can be provided. Further, the cover bodies 108*a* and 108*b* are bonded to the outer frame unit 110 that is placed integrally with the main vibrating unit 102 constituting the quartz vibrating element 10. In this way, the area where the quartz vibrating element is fixed and the area where the cover bodies are bonded can be made the same, which can reduce the space for fixing. Thus, the degradation of the vibrating properties due to the electrode disconnection can be prevented, and a small quartz vibrating element with high shock resistance and with good frequency-temperature characteristics even in the case of temperature change can be provided.

Sixth Embodiment

Figure 10:
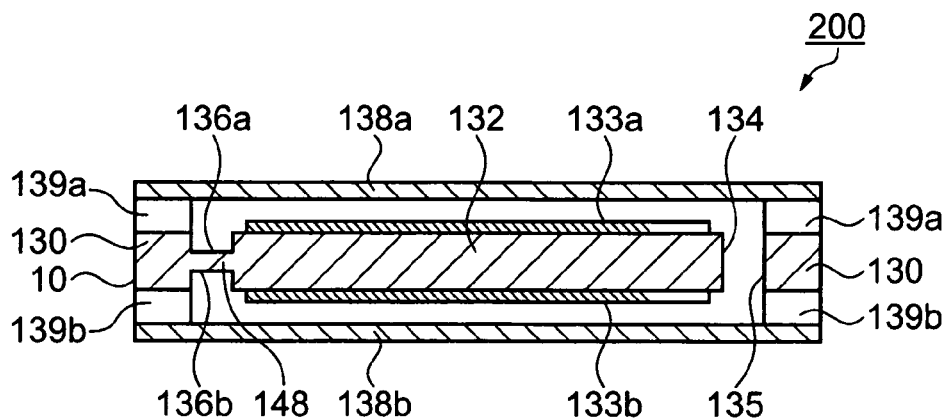
FIG. 10 is a front sectional view showing the outline structure of a quartz vibrator according to a sixth embodiment.
Figure 11A:
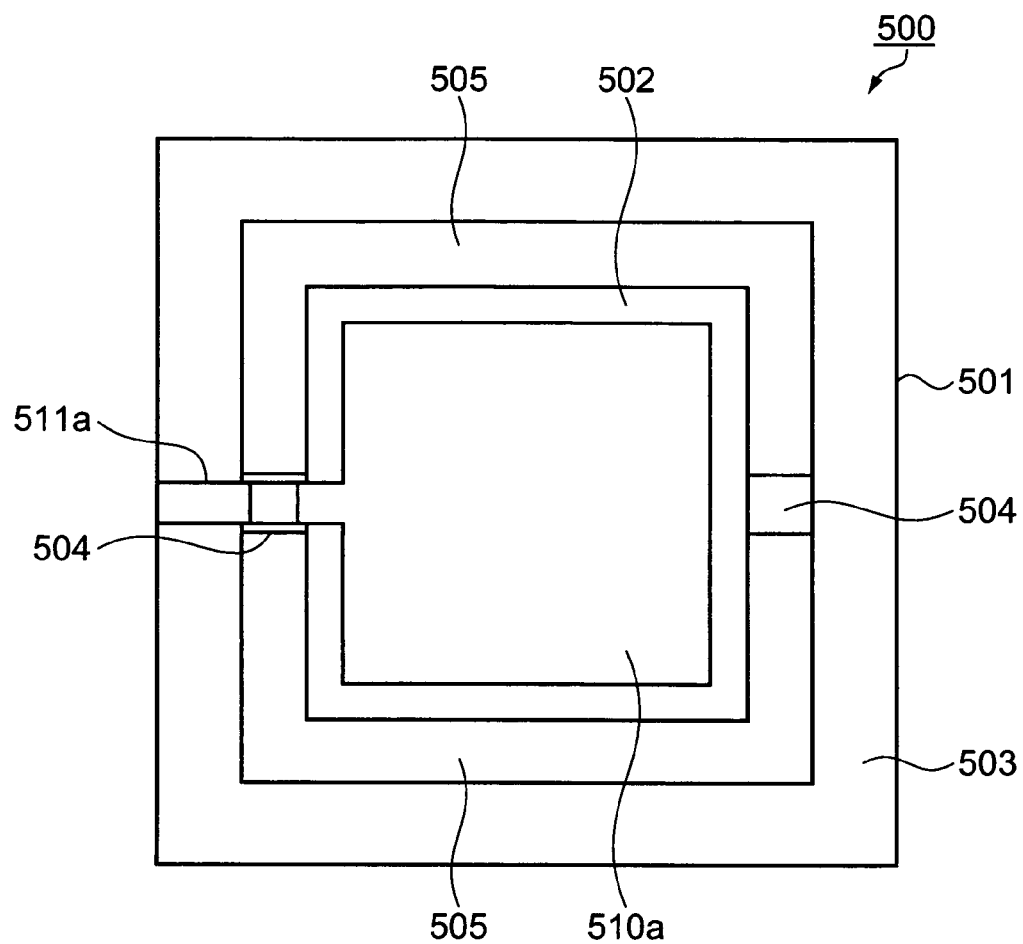
FIG. 11A is a plan view and FIG. 11B is a front sectional view, both showing an AT cut vibrating element that uses a quartz substrate as an example of a conventional piezoelectric vibrating element.
Figure 11B:
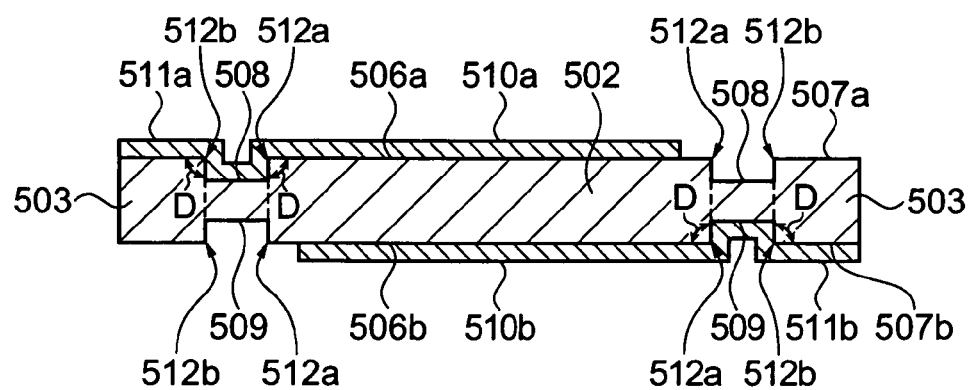

A piezoelectric vibrator according to a sixth embodiment of the invention will be now described with reference to FIG. 10. FIG. 10 is a front sectional view showing the outline structure of a quartz vibrator according to the sixth embodiment.

As shown in FIG. 10, the quartz vibrator 200 as an example of a piezoelectric vibrator according to the second aspect of the invention is composed of the quartz vibrating element 10 explained in the first to the fourth embodiments and the cover bodies 138*a* and 138*b* that are bonded to the top and bottom faces of the outer frame unit 130 of the quartz vibrating element 10 with the frame bodies 139*a* and 139*b*.

The quartz vibrating element 10 is composed of a main vibrating unit 132, exciting electrodes 133*a* and 133*b* that are formed on the top and bottom faces of the main vibrating unit 132, an outer frame unit 130 that is formed approximately along the periphery of the main vibrating unit 132, and a connecting unit 148 that connects the main vibrating unit 132 and the outer frame unit 130.

The main vibrating unit 132 has a rectangular form, the four ends (four sides) of which are formed with the connecting unit 148 and the through hole 135 formed in the surrounding area. At least one end of the X axis direction, which is the vibrating direction of the main vibrating unit 132, is as an open end 134, formed as an open end part by the through hole 135. The other end of the main vibrating unit 132 is connected to the connecting unit 148 that is constituted by the recesses 136*a* and 136*b* and the flat part (not shown).

Borosilicate glass is used for the cover bodies 138*a* and 138*b*. The cover bodies 138*a* and 138*b* are bonded in an airtight way to the top and bottom faces of the outer frame unit 130 with the frame bodies 139*a* and 139*b*. The frame bodies 139*a* and 139*b*, formed in a frame shape approximately along the outer frame unit 130 with a nearly even thickness, function as a spacer for preventing the cover bodies 138a and 138b from contacting with the main vibrating unit 132 and the connecting unit 148 and the like. As the frame bodies 139a and 139b, a metallic ring, a glass ring, or a thermo set adhesive material with a certain thickness in a frame shape can be used, for example.

According to the sixth embodiment, a quartz vibrating element is housed in an airtight way, that prevents the electrode disconnection, has high shock resistance as well as vibrating properties of which are not degraded much even in the case of temperature change. Thus, the degradation of the vibrating properties due to the electrode disconnection can be prevented, and a quartz vibrating element with high shock resistance and with good frequency-temperature characteristics can be provided. Further, the cover bodies 138a and 138b are bonded to the outer frame unit 130 that is placed integrally with the main vibrating unit 132 constituting the quartz vibrating element 10 with the frame bodies 139a and 139b. Using the frame bodies 139a and 139b eliminates the need for making the outer frame unit 130 thicker than the other parts, which can reduce the number of manufacturing processes of the quartz vibrating element 10. Further, the area where the quartz vibrating element is fixed and the area where the cover bodies are bonded can be made the same, which can reduce the space for fixing. Thus, according to the sixth embodiment, the degradation of the vibrating properties due to the electrode disconnection can be prevented, and a small quartz vibrating element with high shock resistance and with good frequency-temperature characteristics even in the case of temperature change can be provided at lower cost.

For the bonding of the top and bottom faces of the outer frame unit and the cover bodies explained in the fifth and the sixth embodiments, other kinds of bonding materials such as a sealing glass, a thermo set adhesive or the like can be also used.

The entire disclosure of Japanese Patent Application No. 2005-052605, filed Feb. 28, 2005 is expressly incorporated by reference herein.

What is claimed is:

1. A piezoelectric vibrating element, comprising:
    a main vibrating unit vibrating in a constant direction, an exciting electrode being formed on a top face and a bottom face of the main vibrating unit;
    an open end formed on at least one of a plurality of ends provided in a vibrating direction of the main vibrating unit;
    an outer frame unit formed so as to surround the main vibrating unit;
    a connecting unit formed so as to connect the main vibrating unit and the outer frame unit, wherein the connection unit is provided between the main vibrating unit and the outer frame unit except an area where the open end is formed, and is composed of a recess concave to a top face of the main vibrating unit and a flat part approximately in parallel with the top face of the main vibrating unit; and
    a connecting electrode formed in a manner of starting from the exciting electrode, passing at least through the top face of the flat part, to the top face of the outer frame unit, wherein an angle $\theta 1$ that makes the top face of the flat part with respect to a connecting face to which the flat part and the outer frame unit are connected, and an angle $\theta 2$ that makes the top face of the outer frame unit with respect to the connecting face satisfy a relation: $90°<\theta 1<270°$ and $90°<\theta 2 \leq 180°$.

2. The piezoelectric vibrating element according to claim 1, wherein the flat part is formed on approximately a same plane surface with the top face of the main vibrating unit.

3. The piezoelectric vibrating element according to claim 1, wherein the top face of the outer frame unit is formed on the approximately same plane surface with the top face of the main vibrating unit and the top face of the flat part.

4. The piezoelectric vibrating element according to claim 1, wherein the open end is formed to both ends of the main vibrating unit in a vibrating direction.

5. A piezoelectric vibrator, comprising:
    a piezoelectric vibrating element according to claim 1; and
    a cover body housing at least the main vibrating unit of the piezoelectric vibrating and being connected to the outer frame unit.

6. The piezoelectric vibrator according to claim 5, wherein the cover body is bonded to the outer frame unit with a frame body having a constant thickness approximately along the outer frame unit.

* * * * *